(12) United States Patent
Han et al.

(10) Patent No.: US 11,632,884 B2
(45) Date of Patent: Apr. 18, 2023

(54) TRANSPARENT EMI SHIELDING FILM AND PRODUCTION METHOD FOR THE SAME

(71) Applicant: Nano and Advanced Materials Institute Limited, Hong Kong (HK)

(72) Inventors: Jianping Han, Hong Kong (HK); Yong Zhu, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 0 days.

(21) Appl. No.: 17/740,381

(22) Filed: May 10, 2022

(65) Prior Publication Data
US 2022/0394892 A1 Dec. 8, 2022

Related U.S. Application Data

(60) Provisional application No. 63/195,059, filed on May 31, 2021.

(51) Int. Cl.
H05K 9/00 (2006.01)
(52) U.S. Cl.
CPC ......... *H05K 9/0092* (2013.01); *H05K 9/0094* (2013.01)
(58) Field of Classification Search
CPC .................................................. H05K 9/0094
See application file for complete search history.

(56) References Cited

U.S. PATENT DOCUMENTS 9,034,419 B2 5/2015 Sasaki et al.
10,091,917 B2 10/2018 Kim et al.
(Continued)

FOREIGN PATENT DOCUMENTS

EP 2099050 A2 9/2009

OTHER PUBLICATIONS

Lee, et al. "Electromagnetic Interference (EMI) Shielding Efficiency (SE) Characteristics of the ITO/Ag Multilayer Structure", Molecular Crystals and Liquid Crystals, vol. 470, 107-120, 2007.
(Continued)

*Primary Examiner* — Hung V Ngo
(74) *Attorney, Agent, or Firm* — Idea Intellectual Limited; Margaret A. Burke; Sam T. Yip

(57) ABSTRACT

The present invention provides a transparent EMI shielding film that includes a first transparent polymeric substrate layer. A first conductive mesh layer having a first pattern is printed on the first layer, the conductive mesh having a line width from approximately 5 µm to approximately 500 µm and having a space between two adjacent conductive lines of 100 µm to 1000 µm. The conductive mesh blocks electromagnetic signals. A second transparent polymeric layer is positioned over the first transparent polymeric substrate layer having the first conductive mesh layer printed thereon. A second conductive mesh layer having a second pattern is printed on the second transparent polymeric layer, the second pattern being substantially identical to the first pattern, and being substantially identically positioned above the first pattern in order to maximize transparent spaces between adjacent conductive lines. The transparency is approximately 80% or greater in a visible light spectral region.

15 Claims, 6 Drawing Sheets

(56) References Cited

U.S. PATENT DOCUMENTS

| | | | | |
|---|---|---|---|---|
| 2009/0126984 | A1* | 5/2009 | Saneto | H05K 9/0096 174/350 |
| 2010/0018765 | A1* | 1/2010 | Suenaga | H05K 9/0096 204/192.15 |
| 2010/0073764 | A1* | 3/2010 | Kai | G02B 5/22 359/359 |
| 2010/0126767 | A1* | 5/2010 | Kotsubo | C23C 18/30 428/407 |
| 2010/0164358 | A1* | 7/2010 | Lee | H05K 9/0096 313/313 |
| 2010/0304069 | A1* | 12/2010 | Oguri | B64D 45/0063 156/308.2 |
| 2011/0116024 | A1* | 5/2011 | Tsuchimoto | G02B 5/0226 349/104 |
| 2011/0122596 | A1* | 5/2011 | Miyazaki | H05K 9/0096 361/818 |
| 2011/0297436 | A1* | 12/2011 | Ohashi | B05D 7/04 428/208 |
| 2012/0325545 | A1* | 12/2012 | Higashitani | H05K 3/1216 174/268 |
| 2013/0294037 | A1* | 11/2013 | Kuriki | H05K 9/00 174/250 |
| 2016/0113161 | A1* | 4/2016 | Ball | H05K 9/0032 174/381 |
| 2016/0289816 | A1* | 10/2016 | Tsuji | C23C 14/34 |

OTHER PUBLICATIONS

Kim, et al. "Metallic Multilayer Sputtering on Polycarbonate for EMI Shielding", Key Engineering Materials, vol. 270-273, 826-830, 2004.

Hu, et al. "Flexible Transparent PES/Silver Nanowires/PET Sandwich-Structured Film for High-Efficiency Electromagnetic Interference Shielding", Langmuir, vol. 28, 7101-7106, 2012.

Wu, et al. "Review on the electromagnetic interference shielding properties of carbon based materials and their novel composites: Recent progress, challenges and prospects", Carbon, vol. 176, 88-105, 2021.

Hu, et al. "Scalable Coating and Properties of Transparent, Flexible, Silver Nanowire Electrodes", ACS Nano, vol. 4, 2955-2963, 2010.

Vishwanath, et al. "Electromagnetic interference shielding effectiveness of invisible metal-mesh prepared by electrohydrodynamic jet printing", Japanese Journal of Applied Physics, vol. 53, 2014.

* cited by examiner

TRANSPARENT EMI SHIELDING FILM AND PRODUCTION METHOD FOR THE SAME

CROSS REFERENCE OF RELATED APPLICATION

This application claims the benefit of U.S. Provisional Patent Application No. 63/195,059 filed May 31, 2021, which is incorporated herein by reference in its entirety.

FIELD OF THE INVENTION

The present invention relates to a transparent electromagnetic interference (EMI) shielding film, and more particularly, to an EMI shielding film having improved EMI shielding effectiveness and transparency. The invention is further related to the methods for producing the transparent EMI shielding film.

BACKGROUND OF THE INVENTION

In recent years, electromagnetic interference (EMI) has rapidly increased with the increase in utilization of various electric installations and electronics-applied devices, particularly communications devices using radio waves. EMI is not only becoming known as a cause of malfunctioning of EMI-sensitive electrical or electronic devices but also as damaging the health of operators of these apparatuses. Therefore, it is necessary to shield and absorb electromagnetic waves generated from electronic devices to prevent such malfunctioning and damaging. Therefore, preparing an EMI shielding film with high EMI shielding effectiveness (EMI SE) is very important.

In addition to EMI shielding effectiveness (EMI SE), an EMI shielding film for display devices or building windows requires high transparency since the EMI shielding film has to permit recognition of what is displayed on a screen or the outside environment. However, since conventional EMI shielding films have low transparency due to the opaqueness of a conductive layer made of functional particles such as metals, EMI shielding films exhibiting good light transmission have been in demand. Transparency and EMI SE are contradictive since most conductive materials are nontransparent. Thus, it is difficult to fabricate EMI shielding materials with high transparency and high EMI SE simultaneously.

Historically, a well-known transparent EMI shielding material is indium tin oxide (ITO), which has been the material of choice due to its relatively high transparency at high conductivities. However, ITO has several shortcomings in that is very brittle and cannot be used in situations which need flexibility. Another transparent EMI shielding material is a thin metal layer with a thickness in the nanometer scale, deposited on a transparent film, usually by vacuum evaporation, magnetron sputtering or a plating method. Recently, conductive nano materials, such as silver nanowire, graphene, or carbon nanotubes are used to fabricate transparent EMI shielding film. The conductive nano materials are dispersed in solvent/water and is coated on the transparent substrate simply by spraying or Mayer rod coating method. However, the high contact resistance between nano materials deteriorates their performance. Meanwhile, the high cost of nano materials also limits their application.

Metal mesh is the most well-known material for EMI shielding materials, since all the metal lines are connected to form a conductive network. In Europe Patent Publication No. EP2099050A2, photolithography is used to manufacture silver mesh with a line width of 9 µm to 12 µm; however, this method is complicated, expensive, not eco-friendly, and its EMI SE is around 20 dB which is lower the regular standard of 30 dB. In order to make the metal line smaller to reach a state of "invisibility", the metal line width needs to be reduced to a size in the order of tens of microns, however even such a thin metal line would affect the EMI SE adversely.

US Patent Publication No. 10,091,917 shows a transparent EMI shielding/absorbing film that includes a transparent substrate having a top surface on which a pattern having a plurality of engraved grooves is disposed, a conductive layer is disposed in the grooves, and a conductive nanowire layer is disposed on the top surface of the transparent substrate and electrically connected with the conductive layer. However, the coating of nano wires is complicated and not environmentally friendly. Moreover, the layer of nano wires will lead to a deterioration of visible light transparency.

Therefore, there is a need in the art for EMI shielding that overcomes the aforementioned problems and satisfies the demand for transparent EMI shielding films capable of exhibiting sufficient EMI shielding performance while simultaneously maintaining good light transmission properties.

SUMMARY OF THE INVENTION

The present invention provides a transparent EMI shielding film that includes a first transparent polymeric substrate layer. A first conductive mesh layer having a first pattern is printed on the first transparent polymeric substrate layer, the conductive mesh having a line width in a range from approximately 5 µm to approximately 500 µm and having a space between two adjacent conductive lines in a range from approximately 100 µm to approximately 1000 µm. The conductive mesh is configured and dimensioned to at least partially block electromagnetic signals from passing through the first transparent polymeric substrate layer. A second transparent polymeric layer is positioned over the first transparent polymeric substrate layer having the first conductive mesh layer printed thereon. A second conductive mesh layer having a second pattern is printed on the second transparent polymeric layer, the second pattern is substantially identical to the first pattern, and the second pattern is substantially identically positioned above the first pattern such that the first pattern and second pattern coincide with one another in order to maximize transparent spaces between adjacent conductive lines. When the two patterns coincide, the transparency is approximately 80% or greater in a visible light spectral region having a wavelength from approximately 400 nm to approximately 700 nm.

The transparent EMI shielding film of the present invention has good EMI shielding performance, transparency, and flexibility. Particularly, the transparent EMI shielding film has at least 30 dB EMI shielding effectiveness in the frequency range of 500 MHz to 5 GHz and the transparent EMI shielding is bendable and stretchable, which is suitable for applying in a wide field of electronic devices.

In another aspect, the present invention provides a transparent EMI shielding film in which the first transparent polymeric substrate layer includes one or more of thermoplastic polyurethane (TPU), polyamide, (PA) polycarbonate (PC), or polyethylene terephthalate (PET).

In another aspect, the present invention provides a transparent EMI shielding film in which the conductive mesh includes silver.

In another aspect, the present invention provides a transparent EMI shielding film in which the pattern of the conductive mesh layer is selected from one or more of a square, a pentagon, or a hexagon.

In another aspect, the present invention provides a transparent EMI shielding film in which the line width of the conductive mesh is in a range from 10 µm to 180 µm.

In another aspect, the present invention provides a transparent EMI shielding film in which the space between two adjacent conductive lines is in the range from 300 µm to 900 µm.

In another aspect, the present invention provides a transparent EMI shielding film in which the EMI SE is at least approximately 30 dB in the frequency range from 500 MHz to 5 GHz.

The present invention provides a method for preparing a transparent EMI shielding film that includes providing a first transparent polymeric substrate layer; printing a first conductive mesh layer using a conductive material on the first transparent polymeric substrate layer, wherein the first conductive mesh has a first pattern having a line width in a range from approximately 5 µm to approximately 500 µm and having a space between two adjacent conductive lines in a range from approximately 100 µm to approximately 1000 µm, the conductive mesh being configured and dimensioned to at least partially block electromagnetic signals from passing through the first transparent polymeric substrate layer; adhering a second transparent polymeric layer on the first transparent polymeric substrate layer having the first conductive mesh layer printed thereon; printing a second conductive mesh layer on the second transparent polymeric substrate layer using a conductive material, wherein the second conductive mesh has a second pattern being substantially identical to the first pattern, and the second pattern being substantially identically positioned above the first pattern such that the first pattern and second pattern coincide with one another in order to maximize transparent spaces between adjacent conductive lines such that the transparency is approximately 80% or greater in a visible light spectral region having a wavelength from approximately 400 nm to approximately 700 nm; and curing the first and second conductive mesh layers.

The preparation method of transparent EMI shielding film utilize the property of repeatability in the printing equipment. The successive printing has improved positioning in the preparation method. That is, two conductive mesh layers are substantially aligned to each other without bias or within 5% bias on the border, wherein the bias is calculated based on the line width. Therefore, the preparation method has potential to apply in scaled process, and the production yield rate is high. Herein, the production yield rate is evaluated by three aspects of the transparent EMI shielding film which are surface integrity, transparency, and EMI shielding effectiveness.

In another aspect, the present invention provides a method for preparing a transparent EMI shielding film in which the first polymeric substrate layer is a thermoplastic polyurethane layer.

In another aspect, the present invention provides a method for preparing a transparent EMI shielding film in which the thickness of the first polymeric substrate layer is in a range from approximately 20 µm to approximately 80 µm.

In another aspect, the present invention provides a method for preparing a transparent EMI shielding film in which the conductive material is silver ink.

In another aspect, the present invention provides a method for preparing a transparent EMI shielding film in which the adhering is performed using an adhesive liquid.

In another aspect, the present invention provides a method for preparing a transparent EMI shielding film in which the printing method is screen printing or electrohydrodynamic (EHD) jet printing.

In another aspect, the present invention provides a method for preparing a transparent EMI shielding film in which the pattern of the conductive mesh layer has a shape of a square, a pentagon, or a hexagon.

In another aspect, the present invention provides a method for preparing a transparent EMI shielding film in which the transparent EMI shielding film has an EMI SE of at least approximately 30 dB in the frequency ranging from 500 MHz to 5 GHz.

In another aspect, the present invention provides a method for preparing a transparent EMI shielding film in which the transparent EMI shielding film has an EMI SE of at least approximately 30 dB in the frequency range from 500 MHz to 5 GHz after being stretched by up to approximately 30%.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Below the preferred embodiments of the present invention are described; it should be appreciated that preferred embodiment described herein only is used for description and interpretation of the present invention, and not to be used as limiting the present invention.

Figure 1A:
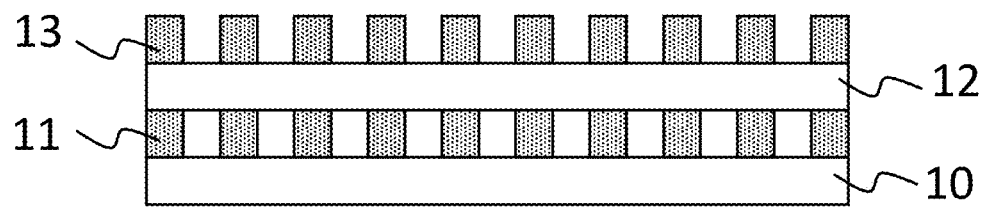
FIG. 1A to 1B are the cross-sectional views of the transparent EMI shielding multilayer film without misalignment and with misalignment.
Figure 1B:
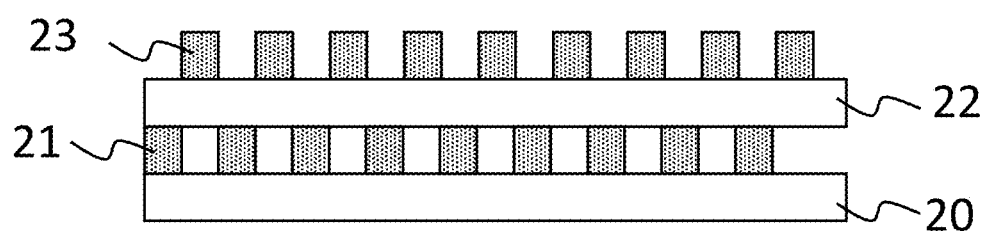

The present invention provides a transparent EMI shielding film and a production method for the same. FIGS. 1A and 1B, schematically depict side cross-sectional views of the transparent EMI shielding film. In FIG. 1A, layer 10 is the first transparent polymeric substrate layer, layer 11 is the first conductive mesh layer, layer 12 is the second transparent polymeric substrate layer; and layer 13 is the second conductive mesh layer. Besides, the two conductive mesh layers of the transparent EMI shielding film 1, namely layer 11 and layer 13, overlap without misalignment. In FIG. 1B, layer 20 is the first transparent polymeric layer, layer 21 is the first conductive mesh layer, layer 22 is the second transparent polymeric layer; and layer 23 is the second conductive mesh layer. Besides, the two conductive mesh layers of the transparent EMI shielding film 2, namely layer 21 and layer 23, overlap with unacceptable levels of misalignment. The expression "overlap without misalignment" is used to describe patterns that are superimposed over each other to with successive pattern edges not extending beyond approximately 20 microns of each other. Alternatively, the second layer of conductive mesh may be printed with a finer line width so that it falls entirely within the boundary of the first conductive mesh layer. Such a second layer is not considered to be misaligned as it is superposed entirely within the boundary of the first mesh layer.

The transparent EMI shielding film such as FIG. 1A demonstrates both excellent EMI shielding performance and light transmission properties since the first conductive mesh layer overlaps with the second conductive mesh layer without misalignment.

The transparent polymeric film layer may be selected from a variety of transparent polymeric materials, in particular, thermoplastic polymeric materials. Exemplary polymeric materials include one or more of thermoplastic polyurethane (TPU), polyamide (PA) polycarbonate (PC), and polyethylene terephthalate (PET).

The conductive mesh may be selected from any material that has capability of blocking electromagnetic waves such as metal, metal alloy, graphite, graphene, conductive ceramic, and mixtures thereof. In particular, conductive inks including silver, copper, nickel, are selected for use in depositing the conductive mesh materials on the polymeric substrates.

Figure 2A:
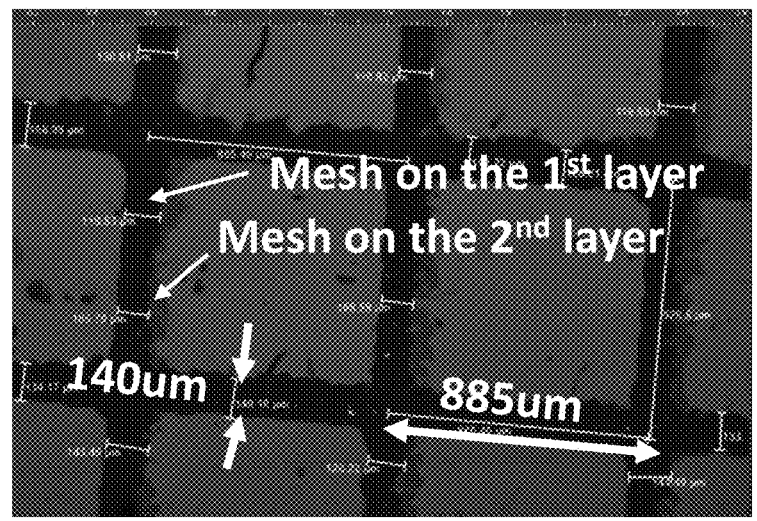
FIG. 2A to 2B are the microscopy comparison of two conductive mesh layers overlapped without and with misalignment.
Figure 2B:
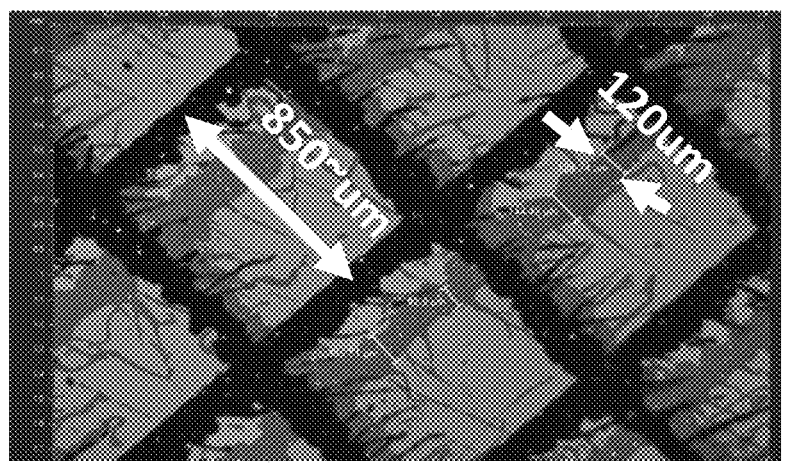
Figure 3A:
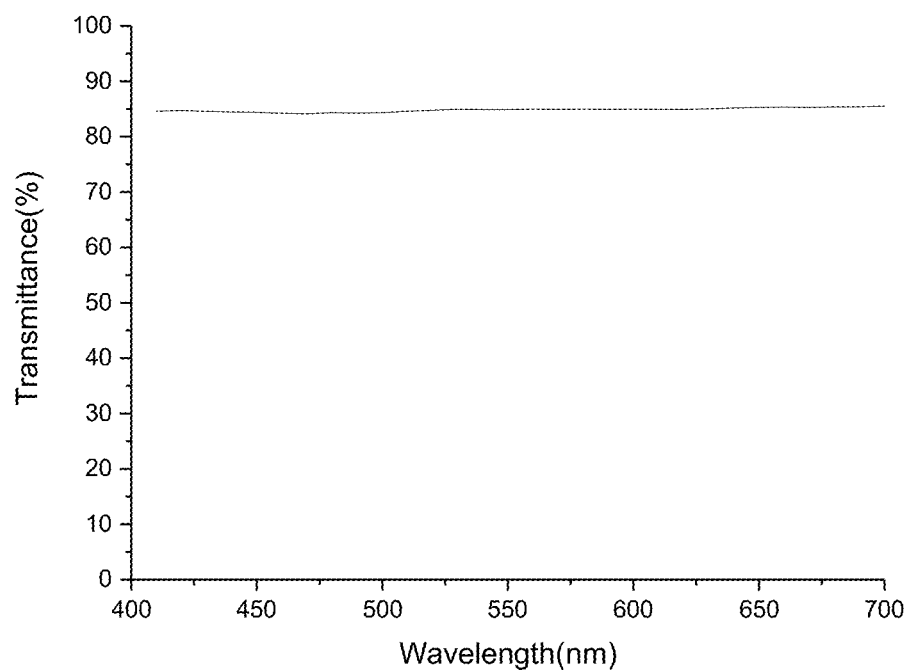
FIG. 3A shows the transparency of the transparent EMI shielding film with the pattern Square 40-900.
Figure 3B:
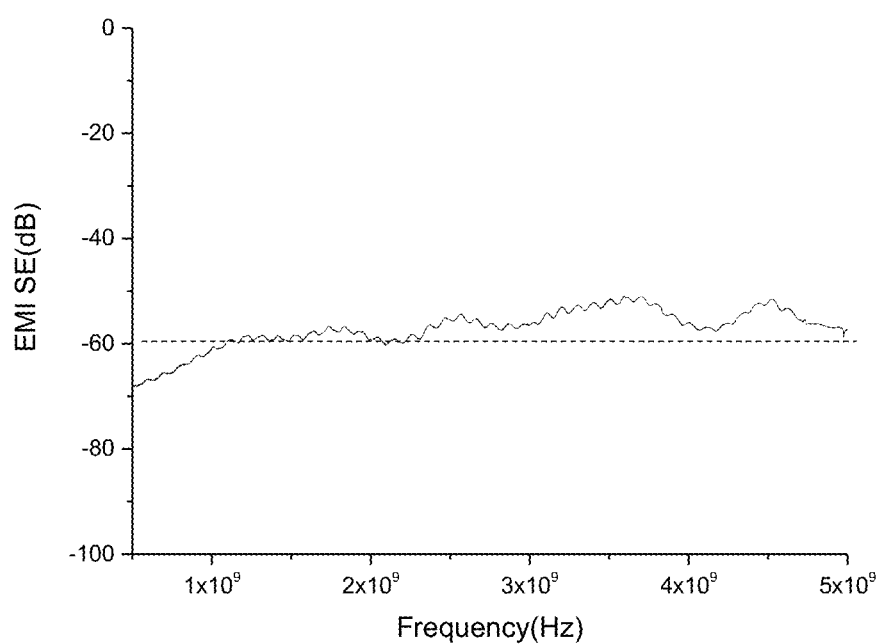
FIG. 3B is the EMI SE (plus 20 dB attenuator) of the transparent EMI shielding film with pattern Square 40-900.

FIGS. 2A and 2B show the microscopy comparison of two conductive mesh layers overlapped without and with misalignment. In FIG. 2A, the two conductive mesh layers with the same pattern overlap each other without misalignment; this structure has an approximately 85% transparency level (as shown in FIG. 3A) and the EMI SE is 40 dB (as shown in FIG. 3B). In contrast, FIG. 2B shows two conductive mesh layers with the same pattern overlapped with misalignment. As seen in FIG. 2B, one portion of the mesh line partially coincides with a bottom line; the line is shifted by approximately 50 percent of the line width. The mesh line normal to the shifted line is completely shifted from the other line pattern. As a result, the film in FIG. 2B only has 65% transparency and the EMI SE is 40 dB. The comparison of the patterns of FIG. 2A and FIG. 2B show that the transparency is directly related to whether the two conductive mesh layers overlap without misalignment.

The first conductive mesh may be selected to have a first pattern with a line width in a range from approximately 5 μm to approximately 500 μm. A space between two adjacent conductive lines ranges from approximately 100 μm to approximately 1000 μm. In one of the embodiments, a conventional repeating grid pattern such as geometric shapes including a square, a pentagon, a hexagon, a triangle, or other shapes. In one aspect, the conductive line width is from 10 μm to 50 μm and the conductive line-line distance from 300 μm to 900 μm. For example, square 20-400 means a square shaped mesh with line width 20 μm, line-line distance 400 nm; square 40-900 means a square shaped mesh with line width 40 μm, line-line distance 900 nm; and hexagon 50-850 means a hexagon shape with line width 50 μm, line-line distance 850 nm. These patterns are depicted in FIG. 4A to 4C.

Figure 4A:
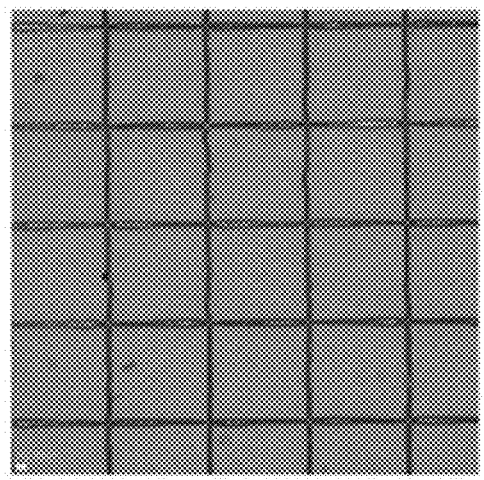
FIG. 4A to 4C are the microscopy images of the unstretched conductive mesh layer.
Figure 4B:
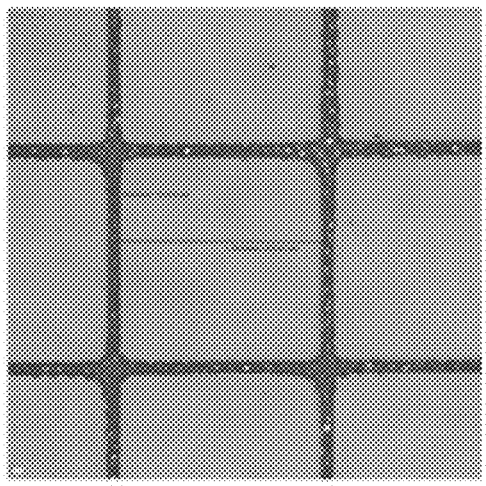
Figure 4C:
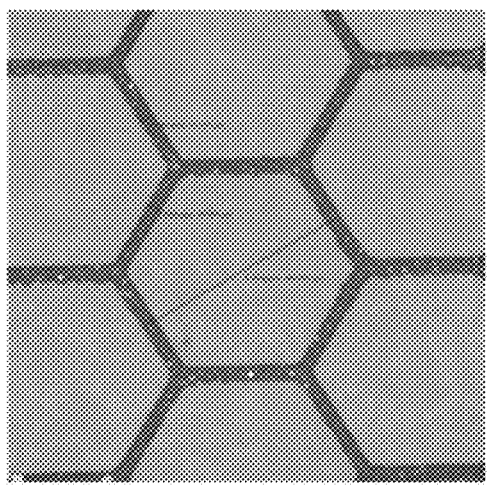

FIG. 4A to 4C shows the microscopy images of the conductive mesh layer. FIG. 4A is Square 20-400, FIG. 4B is Square 40-900, and FIG. 4C is Hexagon 50-850, respectively. Since the conductive ink in the present invention may be a flexible sliver ink, the conductive line can undergo certain elongation without breaking.

Figure 5:
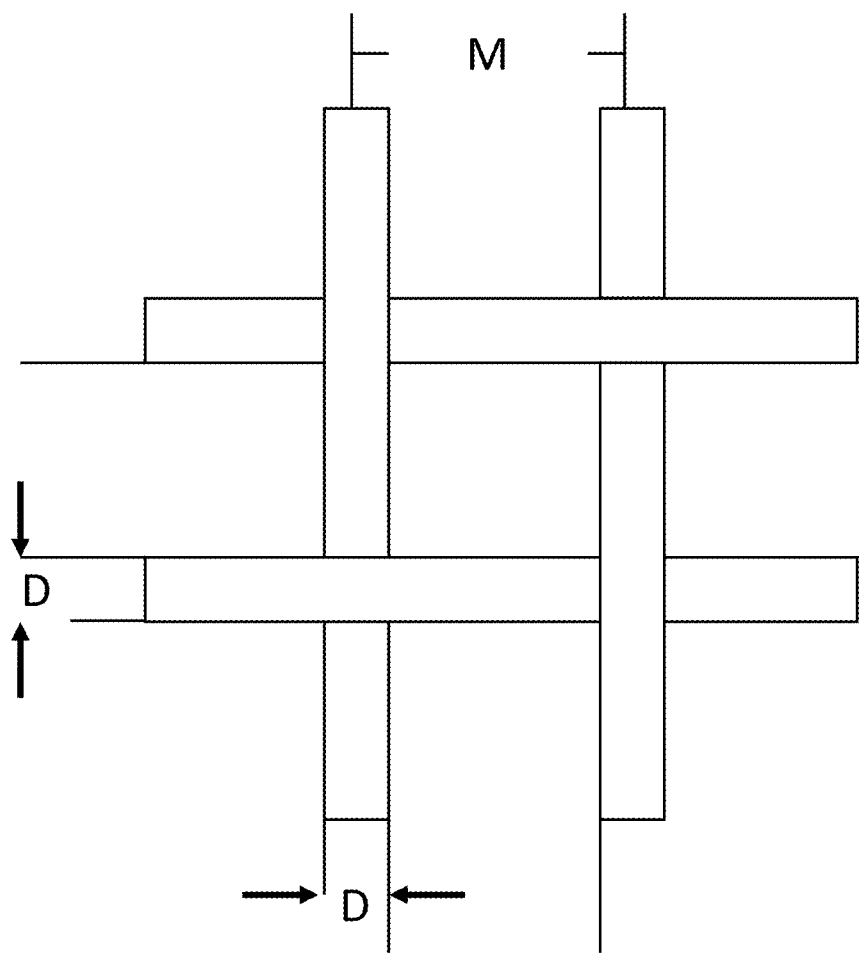
FIG. 5 illustrates one mesh square in the conductive mesh layer.
Figures 6A, 6B:
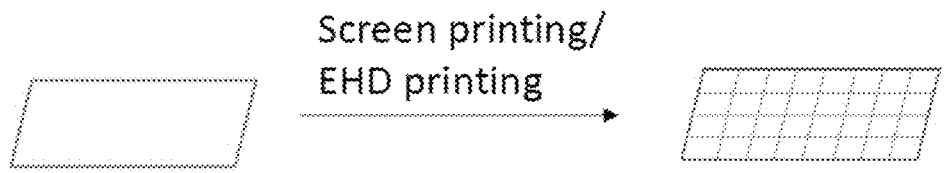
FIG. 6A to 6F shows the preparation method of one embodiment of the transparent EMI shielding film.
Figures 6C, 6D:
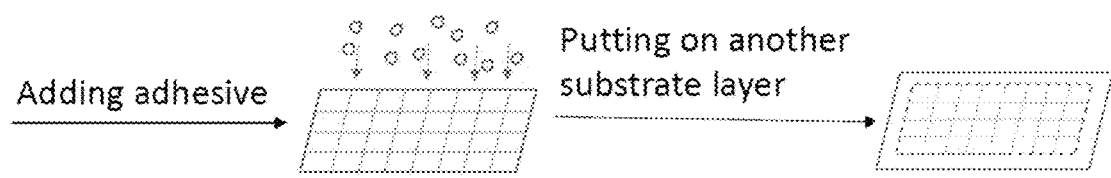
Figures 6E, 6F:
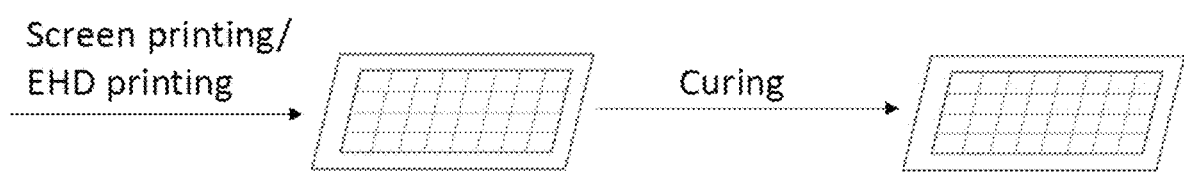

The mesh count of the conductive mesh layer is calculated using the following equation and the mesh in FIG. 5 is seen as an example accordingly.

Mesh count=1/line-line distance (inch)

The transmittance is using the following equation:

Transmittance (Prediction)=Transmittance of Substrate*Open area

% Open Area=$[1-(M \times D)]^2 \times 100$

Where M is line-line distance; D is the diameter of wire (inches).

The EMI shielding effectiveness is tested by ASTM D 4935-99 and is able to be described by the following equation:

$$EMI\ SE = 10\log\left|\frac{\text{Power of transmitted wave}}{\text{Power of incident wave}}\right|(dB)$$

$$= SE_{Reflection} + SE_{Absorption} + SE_{Multiple\ Reflection}$$

FIGS. 3A and 3B show the transparency and the EMI SE of the transparent EMI shielding film with the pattern square 40-900. In FIG. 3A, the two layers of conductive mesh with the pattern square 40-900 overlap without misalignment and the transparent substrate layer is a TPU layer. The transparency is above 85% in a visible light spectral region having a wavelength from approximately 400 nm to approximately 700 nm. The transparency is not substantially less than a one-layer conductive mesh layer with square 40-900, as seen in Table 1, where the one-layer conductive mesh layer with square 40-900 has the transparency 91%.

FIG. 3B measures the EMI SE of the two layers of conductive mesh with the pattern Square 40-900, overlapped without misalignment, and the transparent substrate layer being a TPU layer. The numerical results of EMI SE with attenuator and without attenuator are listed in Table 2. The transparent EMI shielding film has an average EMI SE of approximately 40 dB in the frequency range from 500 MHz to 5 GHz without attenuator. As for the transparency, as mentioned before, the transparency is above 85% in a visible light spectral region having a wavelength from approximately 400 nm to approximately 700 nm. According to the above mentioned embodiments, the EMI SE of the transparent EMI shielding film improved without affecting the transparency adversely.

TABLE 1

| Mesh | Ink | Substrate | Mesh count | Open area calculated | Transmittance of visible light (one layer structure) | One layer EMI Shielding Effectiveness |
|---|---|---|---|---|---|---|
| 20-300 | CB028 | TPU | 85.5 | 87.1% | 72% | 35 dB |
| 20-600 | CB028 | TPU | 42.7 | 93.4% | 93% | 30~35 dB |

TABLE 1-continued

| Mesh | Ink | Substrate | Mesh count | Open area calculated | Transmittance of visible light (one layer structure) | One layer EMI Shielding Effectiveness |
|---|---|---|---|---|---|---|
| 40-800 | CB028 | TPU | 32 | 90.3% | 89% | 35~40 dB |
| 40-900 | CB028 | TPU | 28.5 | 91.3% | 91% | 35 dB |
| 30-600 | CB028 | TPU | 42.7 | 90.2% | 88% | 32~35 dB |
| 30-700 | CB028 | TPU | 36.6 | 91.6% | 88% | 35~38 dB |

TABLE 2

| | Frequency | | | | | | | |
|---|---|---|---|---|---|---|---|---|
| | 500 MHz | 1.0 GHz | 2.0 GHz | 3.0 GHz | 4.0 GHz | 5.0 GHz | Average | Standard Deviation |
| EMI Shielding Effectiveness (with attenuator) | −68.0 dB | −60.9 dB | −59.3 dB | −56.6 dB | −56.0 dB | −57.3 dB | −60 dB | 4.5 |
| EMI Shielding Effectiveness (without attenuator) | −48 dB | −40.9 dB | −39.3 dB | −36.6 dB | −36 dB | −37.3 dB | −40 dB | 4.5 |

FIG. 6A to 6F shows the manufacturing process of the transparent EMI shielding film by consecutively fabrication of two conductive mesh layers having the same patterns. The fabrication includes the following procedure: Providing a first transparent polymeric layer (layer 10 in FIG. 1A), such as a TPU film on the working platform. To avoid displacement, the TPU film may be optionally fixed by vacuum suction on the working platform. A first conductive mesh layer (layer 11 in FIG. 1A) may be deposited, for example, by screen printing or EHD jet printing using a flexible conductive ink. In this embodiment, the material of the conductive ink is selected to be one kind of flexible silver ink.

To prepare the first layer of conductive mesh on a transparent substrate to receive a second polymeric substrate over the first layer, an adhesive solution with acetone as the solvent is sprayed on the first TPU film (layer 10 in FIG. 1A). The second polymeric film such as a TPU film (layer 12 in FIG. 1A) is adhered over the first TPU film with first conductive mesh disposed thereon. The second conductive mesh layer (layer 13 in FIG. 1A) is deposited on the second transparent polymeric substrate layer using the flexible silver ink. The second conductive mesh has a second pattern that is substantially identical to the first pattern, and the second pattern is substantially identically positioned above the first pattern such that the first pattern and second pattern coincide with one another in order to maximize transparent spaces between adjacent conductive lines. The two silver conductive mesh layers are heat treated, optionally in an oven at an elevated temperature of approximately 100° C. for 2 hrs. The silver ink particles are sintered together during heat treatment, forming a continuous conductive path.

The following examples are presented to illustrate the present disclosure. They are not intended to be limiting in any manner.

EXAMPLE

Example 1

A first transparent polymeric substrate layer, which is a TPU film, with a thickness of 50 μm was fixed on the working platform of an auto screen printing equipment (Type: MT-320 TVC, Manufacturer: Micro-Tec Co., Ltd.) by vacuum suction. Then the first conductive mesh layer was deposited using a stainless 500 mesh filter having pattern of Square 40-900 as the mask and was fixed in position. A conductive flexible silver ink, CB-028, which is manufactured by Dupont company, was used to print the first conductive mesh on the first TPU film.

A small amount of acetone was sprayed on the first TPU film. After spraying, the second transparent polymeric substrate layer, which is a second TPU film, with a thickness of 50 μm was adhered to the first TPU film by the acetone and vacuum suction. A second conductive mesh layer using the same stainless 500 mesh filter having the same pattern of Square 40-900 of the first conductive mesh layer was used as the mask and fixed in position. The conductive silver ink, CB-028, was used as the second conductive mesh and printed on the second TPU film. Since the second pattern was substantially identically positioned above the first pattern such that the first pattern and second pattern coincide with one another, the two TPU films and mesh layers are all fixed in the same position without misalignment. Then the multilayer film was sintered in oven at 100° C. for 2 hrs.

The transparent EMI shielding film produced by Example 1 had a transparency of 85% from 400 nm to 700 nm and had the EMI SE of 40 dB from 500 MHz to 5 GHz.

Example 2

The first transparent polymeric substrate layer, which is a first TPU film, with thickness of 50 μm was fixed on the working platform of an EHD jet printer (Type: EHDJet H, Manufacturer: Sygole Co., Ltd.) by vacuum suction. Then the first conductive mesh layer with a pattern of Square 20-400 as the mask and fixed in position. A conductive flexible silver ink, CB-028, which is manufactured by Dupont company was used as the first conductive mesh was then printed on the first TPU film by EHD jet printing. A small amount of acetone was used to create an adhesive effect and sprayed on the first TPU film. After spraying, the second transparent polymeric substrate layer, which is the second TPU film, with thickness of 50 μm was placed on the first TPU film. The two TPU films were then adhered by the acetone and vacuum suction. The second conductive mesh layer having the same pattern of Square 20-400 of the first conductive mesh layer was used as the mask and was fixed in position. The conductive silver ink, CB-028, was used as the second conductive mesh and was printed on the second TPU film. Since the second pattern was substantially identically positioned above the first pattern such that the first pattern and second pattern coincide with one another, the two TPU films and mesh layers were all fixed without misalignment. Then the multilayer film was then sintered in oven at 100° C. for 2 hrs.

The transparent EMI shielding film produced by Example 2 has transparency of 86% from 400 nm to 700 nm and EMI SE of 40 dB from 500 MHz to 5 GHz.

Comparative Example 1

A first transparent polymeric substrate layer, which is a TPU film, with a thickness of 50 μm was fixed on the working platform of an auto screen printing equipment (Type: MT-320 TVC, Manufacturer: Micro-Tec Co., Ltd.) by vacuum suction. Then the first conductive mesh layer and the second conductive mesh layer were deposited using the same stainless 500 mesh filter having the same pattern of Square 40-900 were used as the masks and fixed in position. The conductive silver ink, CB-028, was used as the first conductive mesh and second conductive mesh. The first conductive mesh was first printed on the TPU film, and then the TPU film with first conductive mesh was flipped and the second conductive mesh was printed thereon. Since the screen printing equipment required repositioning for the opposite surface printing, two mesh layers existed inevitable misalignment. Then the multilayer film was sintered in oven at 100° C. for 2 hrs.

The transparent EMI shielding film produced by Comparative Example 1 had a transparency of 63% to 66% from 400 nm to 700 nm and had the EMI SE of 40 dB from 500 MHz to 5 GHz.

Comparative Example 2

A first transparent polymeric substrate layer, which is a TPU film, with a thickness of 50 μm was fixed on the working platform of an auto screen printing equipment (Type: MT-320 TVC, Manufacturer: Micro-Tec Co., Ltd.) by vacuum suction. Then a first conductive mesh layer was deposited using a stainless 500 mesh filter having pattern of Square 40-900 as the mask and was fixed in position. A conductive flexible silver ink, CB-028 was used to print the first conductive mesh on the first TPU film.

A second transparent polymeric substrate layer, which is a TPU film, with a thickness of 50 μm was fixed on the working platform of an auto screen printing equipment (Type: MT-320 TVC, Manufacturer: Micro-Tec Co., Ltd.) by vacuum suction. Then a second conductive mesh layer was deposited using the same stainless 500 mesh filter having the same pattern of Square 40-900 of the first conductive mesh layer was used as the mask and fixed in position. The conductive silver ink, CB-028, was used as the second conductive mesh and printed on the second TPU film.

The two transparent polymeric substrate layers printed with the mesh pattern were laminated together and the multilayer film was sintered in oven at 100° C. for 2 hrs. Since the two transparent polymeric substrate layers underwent screen printing independently, they had inevitable bias while aligning to each other, which resulted in misalignment between two mesh layers.

The transparent EMI shielding film produced by Comparative Example 2 had a transparency of 74% to 75% from 400 nm to 700 nm and had the EMI SE of 40 dB from 500 MHz to 5 GHz.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The invention claimed is:

1. A transparent electromagnetic interference shielding film comprising:
   a first transparent polymeric substrate layer;
   a first conductive mesh layer having a first pattern printed on the first transparent polymeric substrate layer, the first conductive mesh having a line width in a range from approximately 5 μm to approximately 500 μm and having a space between two adjacent conductive lines is a range from approximately 100 μm to approximately 1000 μm, the first conductive mesh being configured and dimensioned to at least partially block electromagnetic signals from passing through the first transparent polymeric substrate layer;
   a second transparent polymeric layer positioned over the first transparent polymeric substrate layer having the first conductive mesh layer printed thereon;

a second conductive mesh layer having a second pattern printed on the second transparent polymeric layer, the second pattern being substantially identical to the first pattern, and the second pattern being substantially identically positioned above the first pattern such that the first pattern and second pattern coincide with one another in order to maximize transparent spaces between adjacent conductive lines such that the transparency is approximately 80% or greater in a visible light spectral region having a wavelength from approximately 400 nm to approximately 700 nm.

2. The transparent electromagnetic interference shielding film of claim 1, wherein the first transparent polymeric substrate layer comprises one or more of thermoplastic polyurethane, polyamide, polycarbonate, or polyethylene terephthalate.

3. The transparent electromagnetic interference shielding film of claim 1, wherein the first conductive mesh includes silver.

4. The transparent electromagnetic interference shielding film of claim 1, wherein the first and second patterns of the conductive mesh layers are selected from one or more of a square, a pentagon, or a hexagon.

5. The transparent electromagnetic interference shielding film of claim 1, wherein the line width of the first conductive mesh is in a range from 10 μm to 180 μm.

6. The transparent electromagnetic interference shielding film of claim 1, wherein the space between two adjacent conductive lines is in the range from 300 μm to 900 μm.

7. The transparent electromagnetic interference shielding film of claim 1, wherein electromagnetic interference shielding effectiveness (EMI SE) is at least approximately 30 dB in the frequency range from 500 MHz to 5 GHz.

8. A method for preparing a transparent electromagnetic interference shielding film comprising:
providing a first transparent polymeric substrate layer;
printing a first conductive mesh layer using a conductive material on the first transparent polymeric substrate layer, wherein the first conductive mesh layer has a first pattern having a line width in a range from approximately 5 μm to approximately 500 μm and having a space between two adjacent conductive lines in a range from approximately 100 μm to approximately 1000 μm, the first conductive mesh layer being configured and dimensioned to at least partially block electromagnetic signals from passing through the first transparent polymeric substrate layer;
adhering a second transparent polymeric layer on the first transparent polymeric substrate layer having the first conductive mesh layer printed thereon;
printing a second conductive mesh layer on the second transparent polymeric substrate layer using a conductive material, wherein the second conductive mesh layer has a second pattern being substantially identical to the first pattern, and the second pattern being substantially identically positioned above the first pattern such that the first pattern and second pattern coincide with one another in order to maximize transparent spaces between adjacent conductive lines such that the transparency is approximately 80% or greater in a visible light spectral region having a wavelength from approximately 400 nm to approximately 700 nm; and
curing the first and second conductive mesh layers.

9. The method of claim 8, wherein the first polymeric substrate layer is a thermoplastic polyurethane layer.

10. The method of claim 9, wherein the thickness of the first polymeric substrate layer is in a range from approximately 20 μm to approximately 80 μm.

11. The method of claim 8, wherein the conductive material of the first conductive mesh layer is silver ink.

12. The method of claim 8, wherein the adhering is performed using an adhesive liquid.

13. The method of claim 8, wherein the printing method is screen printing or electrohydrodynamic jet printing.

14. The method of claim 8, wherein the pattern of the first and second conductive mesh layers has a shape of a square, a pentagon, or a hexagon.

15. The method of claim 8, wherein the transparent electromagnetic interference shielding film (EMI SE) has an electromagnetic interference shielding effectiveness of at least approximately 30 dB in the frequency range from 500 MHz to 5 GHz.

* * * * *